United States Patent [19]
Kaida

[11] Patent Number: 6,040,652
[45] Date of Patent: Mar. 21, 2000

[54] PIEZOELECTRIC RESONATOR ADAPTED TO GENERATE A HARMONIC WAVE IN A THICKNESS EXTENSIONAL VIBRATION MODE

[75] Inventor: Hiroaki Kaida, Moriyama, Japan

[73] Assignee: Murata Manufacturing Co., Ltd, Japan

[21] Appl. No.: 09/212,943

[22] Filed: Dec. 16, 1998

[30] Foreign Application Priority Data

Dec. 24, 1997 [JP] Japan ..................... 9-355606

[51] Int. Cl.[7] ........................... H03H 9/15
[52] U.S. Cl. ........................... 310/320; 310/366
[58] Field of Search ............... 310/320, 321, 310/365, 366

[56] References Cited

U.S. PATENT DOCUMENTS

| | | | |
|---|---|---|---|
| 4,652,784 | 3/1987 | Inoue et al. | 310/320 |
| 4,894,580 | 1/1990 | Ogawa | 310/320 |
| 5,294,860 | 3/1994 | Gamo | 310/320 |
| 5,548,179 | 8/1996 | Kaida | 310/367 |

FOREIGN PATENT DOCUMENTS

| | | | |
|---|---|---|---|
| 1 247 415 | 8/1963 | Germany | 310/365 |
| 62-22-11 | 9/1987 | Japan | 310/366 |

*Primary Examiner*—Thomas M. Dougherty
*Attorney, Agent, or Firm*—Graham & James LLP

[57] ABSTRACT

A piezoelectric resonator adapted to generate a harmonic wave in a thickness extensional vibration mode includes a piezoelectric member, a plurality of excitation electrodes disposed on or within the piezoelectric member and superposed on one another in the thickness direction of the piezoelectric member with piezoelectric layers of the piezoelectric member interposed therebetween, lead-out electrodes respectively connected to the excitation electrodes and extending to side surfaces of the piezoelectric member at the same vertical positions as the excitation electrodes, and a dummy electrode disposed at least one of the vertical positions at which the excitation electrodes are disposed and at such a position so as to have a symmetrical relationship relative to the corresponding excitation electrode with the lead-out electrode connected to the excitation electrode.

19 Claims, 7 Drawing Sheets

PIEZOELECTRIC RESONATOR ADAPTED TO GENERATE A HARMONIC WAVE IN A THICKNESS EXTENSIONAL VIBRATION MODE

BACKGROUND OF THE INVENTION

1. Field of the Invention

The present invention relates to a piezoelectric resonator adapted to generate a harmonic wave in a thickness extensional vibration mode. More particularly, the present invention relates to the above-described piezoelectric resonator including a plurality of excitation electrodes superposed on one another in a thickness direction of the resonator with piezoelectric layers interposed between the excitation electrodes.

2. Description of the Related Art

A laminated piezoelectric resonator utilizing a harmonic wave in a thickness extensional vibration mode is known. The piezoelectric resonator of this type is disclosed in Japanese Patent Laid-Open Publication No. 176110/1989, for example, and is shown in the exploded perspective view of FIG. 10. This piezoelectric resonator has an excitation electrode 52 disposed at a central portion on an upper surface of a piezoelectric layer 51, an excitation electrode 54 disposed at a central portion on an upper surface of a piezoelectric layer 53, and an excitation electrode 55 disposed at a central portion on a lower surface of the piezoelectric layer 53. In FIG. 10, the excitation electrode 55 is shown by being projected on a plane at the bottom.

Thin lead-out electrodes 52a, 54a and 55a are arranged to extend continuously from the excitation electrodes 52, 54, and 55, respectively. Each of the lead-out electrode 52a, 54a and 55a extends to an edge of the piezoelectric layer 51 or 53.

As shown in FIG. 11, in this piezoelectric resonator, the portions of excitation electrodes 52, 54 and 55 superposed on one another and the portions of piezoelectric layers 51 and 53 interposed between the electrodes constitute a vibrating section, in which a thickness extensional vibration is excited at a harmonic frequency when an alternating current is applied between the excitation electrode 54 and the excitation electrodes 52 and 55.

However, the above-described piezoelectric resonator experiences a problem in that vibration in an oblique symmetrical mode (A mode) occurs when the resonator is driven. The A mode vibration appears as a ripple in the resonance characteristic.

To manufacture the above-described piezoelectric resonator, a mother piezoelectric body 56 corresponding to a planar array of a plurality of laminate pieces formed of piezoelectric layers 51 and 53 as shown in FIG. 12 is provided. Unit laminates each corresponding to one piezoelectric resonator are obtained by cutting the mother piezoelectric body 56 along broken lines A to C in FIG. 12 parallel to the thickness direction. In FIG. 12, the electrode films formed in the piezoelectric body 56 are indicated at 58 while excitation electrodes 52 and lead-out electrodes 52a formed on the upper surface of the mother piezoelectric body 56 are not shown.

Electrode films 58 are provided to form the internal excitation electrodes 54 and lead-out electrodes 54a shown in FIG. 10. Edges of lead-out electrodes 54a can be reliably exposed at side surfaces of piezoelectric resonators 57 by cutting along broken lines B.

That is, after preparing the mother piezoelectric body 56 shown in FIG. 12, end surfaces of lead-out electrodes 54a are exposed by cutting internal electrode films 58 along broken lines B. By this cutting step, certain piezoelectric body portions shown between broken lines B and C in FIG. 12 must be removed, which requires unnecessary consumption of the piezoelectric material and the electrode material. This limits attempts to reduce manufacturing cost.

Thus, the above-described conventional piezoelectric resonator adapted to vibrate in the thickness extensional vibration mode has the disadvantage of having a ripple due to an oblique symmetrical mode and having an increased manufacturing cost due to unnecessary consumption of the piezoelectric and electrode materials in a mass production process.

SUMMARY OF THE INVENTION

In order to overcome the problems of the prior art described above, preferred embodiments of the present invention provide a piezoelectric resonator adapted to vibrate in a thickness extensional vibration mode and arranged to substantially eliminate a ripple caused by an oblique symmetrical mode while providing excellent resonance characteristics.

Preferred embodiments of the present invention also provide a method of manufacturing a piezoelectric resonator adapted to vibrate in the thickness extensional vibration mode in which a ripple caused by an oblique symmetrical mode does not occur and which resonator can be efficiently manufactured at a significantly reduced cost.

One preferred embodiment of the present invention provides a piezoelectric resonator adapted to generate a harmonic wave in a thickness extensional vibration mode, including a piezoelectric member, a plurality of excitation electrodes disposed on or within the piezoelectric member and superposed on one another in a thickness direction of the piezoelectric member with piezoelectric layers of the piezoelectric member interposed therebetween, lead-out electrodes respectively connected to the excitation electrodes and extending to side surfaces of the piezoelectric member at the common vertical positions as the excitation electrodes, and a dummy electrode disposed at least one of the vertical positions at which the excitation electrodes are disposed and so as to have a symmetrical relationship relative to the corresponding excitation electrode with the lead-out electrode connected to the excitation electrode.

According to the above described piezoelectric resonator, a dummy electrode is disposed at least one of the vertical positions at which the excitation electrodes are disposed and so as to have a symmetrical relationship relative to the corresponding excitation electrode with the lead-out electrode connected to the excitation electrode. The degree of symmetry of the electrode structure is greatly improved in this manner. Therefore, a ripple caused by an oblique symmetrical mode can be reduced, thus making it possible to obtain an excellent resonance characteristic with a greatly reduced ripple in a thickness extensional vibration piezoelectric resonator using a harmonic wave in a thickness extensional vibration mode.

In the above-described piezoelectric resonator, the piezoelectric member may include a first major surface and a second major surface, and the plurality of excitation electrodes include first and second excitation electrodes disposed on the first and second major surfaces of the piezoelectric member, respectively and an internal excitation electrode disposed within the piezoelectric member.

According to the novel structure and arrangement described above, no piezoelectric material layers exist outside in the thickness direction of the section of the resonator in which the excitation electrodes are laminated. Thus, the number of laminated piezoelectric layers is reduced so as to provide a thickness extensional vibration piezoelectric resonator having a very low cost.

In the above-described piezoelectric resonator, the plurality of excitation electrodes may be disposed within the piezoelectric member and a piezoelectric layer exists outside in the thickness direction of the thickness-direction-outermost excitation electrodes among the plurality of excitation electrodes.

According to the above-described novel structure and arrangement, the plurality of excitation electrodes are disposed at different vertical positions in the piezoelectric member, and piezoelectric layers exist outside in the thickness direction of the thickness-direction-outermost excitation electrodes. In this manner, the moisture-proof characteristic of the vibrating section is greatly improved. Also, the mechanical strength of the thickness extensional vibration piezoelectric resonator is greatly improved because of the existence of the outer piezoelectric layers.

In the above described piezoelectric resonator, the piezoelectric member may be an elongated strip-like piezoelectric member so as to have a longer side and a shorter side and a substantially planar shape.

According to the above-described novel structure and arrangement, a piezoelectric resonant component having a width that is as small as a conventional piezoelectric resonator and using a thickness slip vibration mode can be obtained, thus making it possible to design a much smaller piezoelectric resonator.

In the above described piezoelectric resonator, the lead-out electrodes connected to the first and second excitation electrodes may extend to a side surface of the piezoelectric member and may have substantially the same width as the width of the first and second excitation electrodes.

According to the above-described novel structure and arrangement, the first and second excitation electrodes and the lead-out electrodes connected to the first and second excitation electrodes can be disposed easily and simultaneously in the same manufacturing step.

In the above described piezoelectric resonator, the piezoelectric member may have an elongated rectangular shape including a longer side and a shorter side. In such a case, the lead-out electrodes connected to the first and second excitation electrodes extend to a side surface of the piezoelectric member at an end in the longitudinal direction of the piezoelectric member; and the first and second excitation electrodes are disposed so as to extend to both ends of the piezoelectric member in the width direction of the piezoelectric member.

According to the above-described novel structure and arrangement, piezoelectric resonators adapted to vibrate in a thickness extensional vibration mode can be easily obtained by cutting a mother piezoelectric body along the thickness direction thereof.

Another preferred embodiment of the present invention provides a method of manufacturing the above described piezoelectric resonator, including the steps of preparing a mother piezoelectric body in which a plurality of unit portions each including a plurality of excitation electrodes superposed on one another in a thickness direction thereof with piezoelectric layers interposed therebetween, and electrode films connected to the excitation electrodes respectively are formed by being distributed along a plane, and cutting the mother piezoelectric body in the thickness direction to obtain a plurality of the piezoelectric resonators in such a manner that the electrode films are divided so as to form the excitation electrode in each of the piezoelectric resonators and the dummy electrode of an adjacent one of the piezoelectric resonators.

According to the above-described method, by cutting at the time of dividing the electrode films, the lead-out electrodes are reliably exposed at a side surface of the piezoelectric member while unnecessary consumption of the piezoelectric material and the electrode material is avoided. Therefore, the above-described piezoelectric resonator according to preferred embodiments of the present invention can be efficiently mass-produced, thus reducing the manufacturing cost of the thickness extensional vibration piezoelectric resonator.

Other features and advantages of the present invention will become apparent from the following description of preferred embodiments of the invention which refers to the accompanying drawings.

DETAILED DESCRIPTION OF PREFERRED EMBODIMENTS

Figure 1:
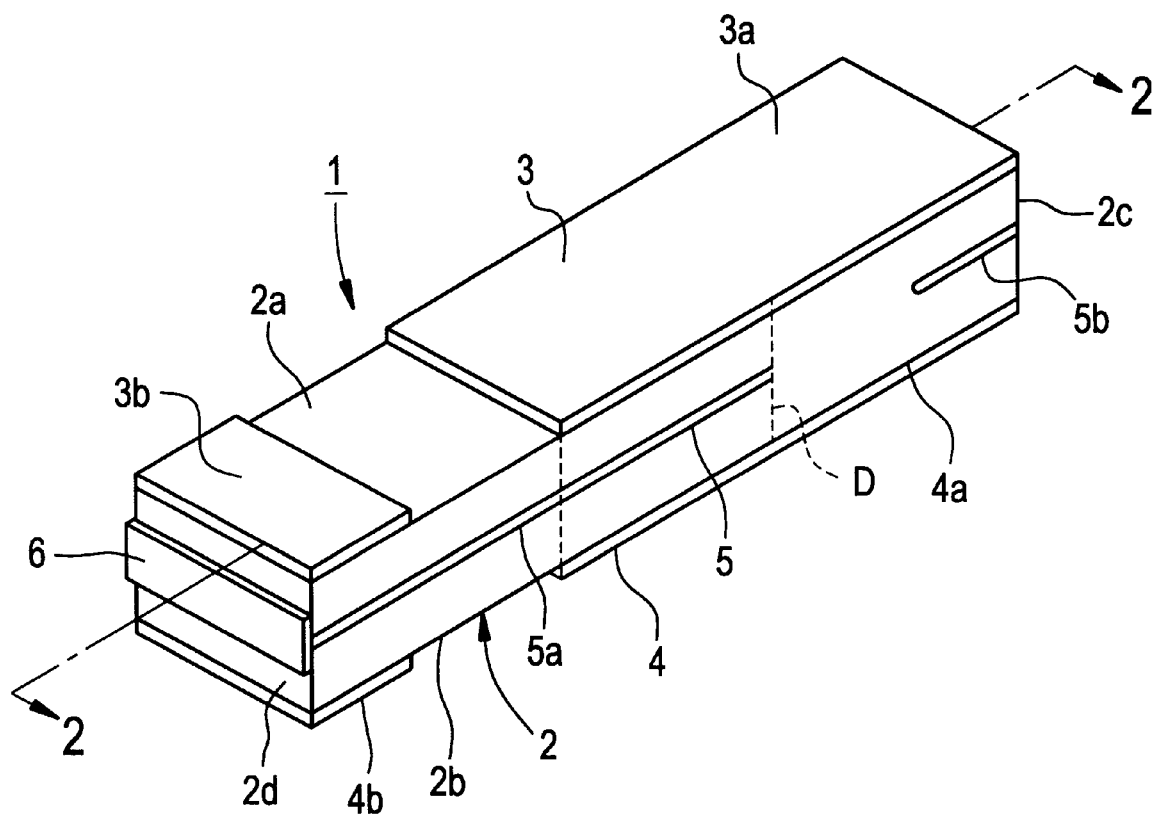
FIG. 1 is a perspective view of a laminated piezoelectric resonator adapted to generate a harmonic wave in a thickness extensional vibration mode which represents a first preferred embodiment of the present invention.

FIG. 1 is a perspective view of a laminated piezoelectric resonator adapted to generate a harmonic wave in a thickness extensional vibration which represents a first preferred embodiment of the present invention. A piezoelectric resonator 1 of this preferred embodiment preferably includes an elongated piezoelectric member 2 having a substantially rectangular plate shape. The piezoelectric member 2 is formed of a piezoelectric ceramic, e.g., a piezoelectric monocrystal of $LiTaO_3$, $LiNbO_3$, quartz or the like, or a piezoelectric ceramic such as lead-zirconate-titanate based ceramic. The piezoelectric member 2 is polarized in the thickness direction if it is formed of a piezoelectric ceramic.

A first excitation electrode 3 is disposed on a first major surface 2a of the piezoelectric member 2. A second excitation electrode 4 is disposed on a second major surface 2b of the piezoelectric member 2. An internal excitation electrode 5 is disposed within the piezoelectric member 2 at a middle vertical position so as to extend between the excitation electrodes 3 and 4 with piezoelectric layers interposed therebetween.

The excitation electrodes 3, 4 and 5 referred to herein are electrode portions superposed on one another in the thickness direction with piezoelectric layers interposed therebetween. That is, in this preferred embodiment, an electrode portion is disposed to extend continuously from the excitation electrode 3 so as to extend to an end surface 2c of the piezoelectric member 2 at one end in the longitudinal direction, and this electrode portion connecting to the excitation electrode 3 defines a lead-out electrode 3a. Similarly, a lead-out electrode 4a is disposed to extend continuously from the excitation electrode 4. Also, a lead-out electrode 5a extending to the other end surface 2d of the piezoelectric member 2 is disposed to extend continuously from the excitation electrode 5.

The section in which the excitation electrodes 3, 4 and 5 are superposed in the thickness direction, i.e., the section defined by broken lines D in FIG. 1, forms a vibrating section, and the above-described lead-out electrodes 3a, 4a, and 5a are located outside of the vibrating section D.

It is not necessary to arrange each of the lead-out electrodes 3a, 4a, and 5a so that a width thereof is equal to the width of the excitation electrodes 3, 4 and 5. Each of the lead-out electrodes 3a, 4a, and 5a may be smaller than the excitation electrodes 3, 4 and 5. In this preferred embodiment, however, for ease of arranging the electrodes, each of the excitation electrodes 3, 4 and 5 and the lead-out electrodes 3a, 4a and 5a is disposed so as to have substantially the same width as the piezoelectric member 2.

In the piezoelectric resonator 1, on the first major surface 2a of the piezoelectric member 2, a dummy electrode 3b is provided at such a position so as to have a symmetrical relationship with the lead-out electrode 3a relative to the excitation electrode 3. Similarly, on the second major surface 2b of the piezoelectric member 2, a dummy electrode 4b is disposed at such a position so as to have a symmetrical relationship with the lead-out electrode 4a relative to the excitation electrode 4. Further, at a substantially middle vertical position in the piezoelectric member 2, i.e., at the height at which the excitation electrode 5 is disposed, a dummy electrode 5b is disposed so as to have a symmetrical relationship with the lead-out electrode 5a relative to the excitation electrode 5b.

A feature of the piezoelectric resonator 1 of this preferred embodiment is that the above-described dummy electrodes 3b, 4b, and 5b are provided and arranged to reduce and substantially eliminate occurrence of a ripple caused by an oblique symmetrical mode. This feature will be explained with reference to FIGS. 2 to 6.

Figure 2:
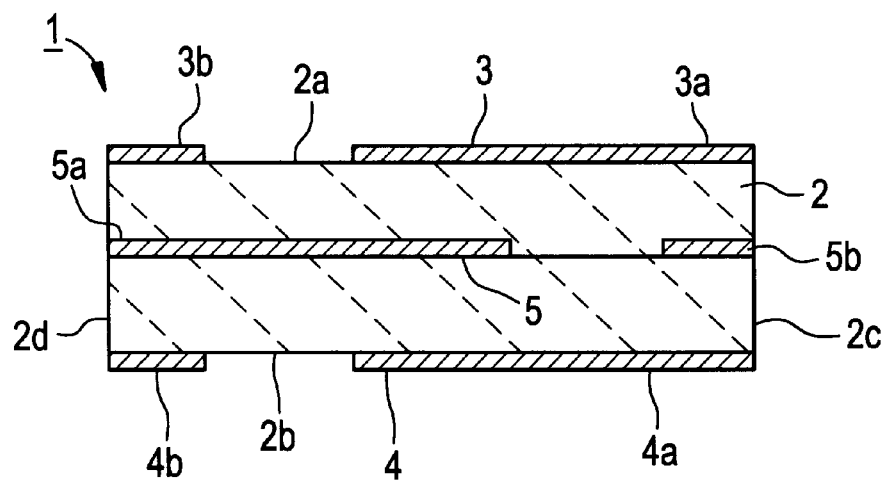
FIG. 2 is a schematic cross-sectional view taken along the line E—E of FIG. 1.

FIG. 2 is a schematic cross-sectional view of the piezoelectric resonator 1 taken along the arrow line E—E of FIG. 1. In the piezoelectric resonator 1, the dummy electrodes 3b, 4b, and 5b are disposed so as to respectively have symmetrical relationships with the lead-out electrodes 3a, 4a, and 5a relative to the excitation electrodes 3, 4 and 5, so that the degree of symmetry of electrode placement is increased, thus making it possible to eliminate occurrence of vibration caused by an oblique symmetrical mode.

Figure 3A:
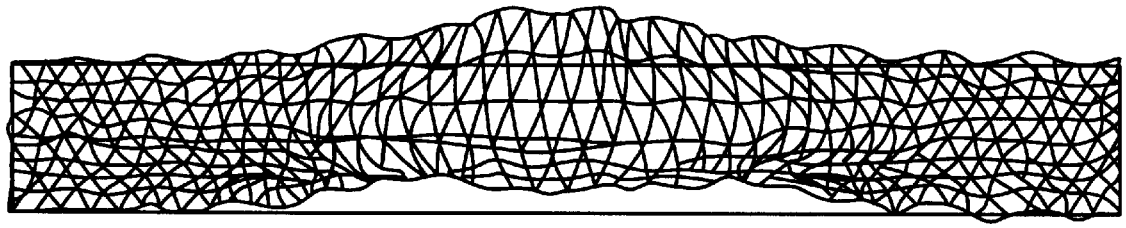
FIGS. 3A and 3B are diagrams respectively showing the results of analysis by a finite element method with respect to a piezoelectric resonator which vibrates at a harmonic wave in a thickness extensional vibration mode and a piezoelectric resonator which vibrates in an oblique symmetrical mode.

That is, in the piezoelectric resonator 1 shown in FIG. 1, the vibrating section D is excited by a second harmonic of thickness extensional vibration when an alternating current voltage is applied between the excitation electrode 5 and the excitation electrodes 3 and 4. FIG. 3A shows the result of analysis by a finite element method of a displacement distribution along the cross section of the thickness extensional vibration piezoelectric resonator 1 taken along the E—E line in FIG. 1.

Figure 3B:
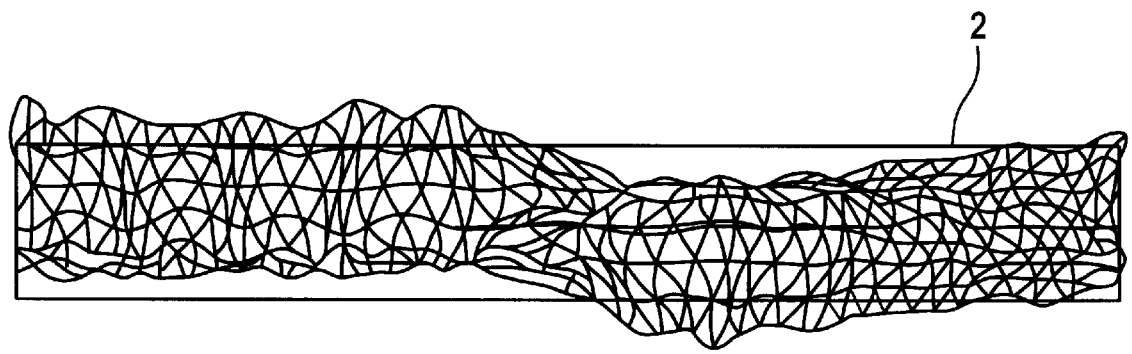

FIGS. 3B shows the result of analysis of a displacement distribution in an oblique symmetrical mode of the above-described thickness extensional vibration piezoelectric resonator 1 made for comparison by the finite element method.

Thus, as in this preferred embodiment, the degree of symmetry of the electrode structure is greatly improved by disposing dummy electrodes 3b, 4b and 5b in a symmetrical relationship relative to the vibrating section D with the lead-out electrodes 3a, 4a and 5a extending from the vibrating section D, thus limiting vibration generated in an oblique symmetrical mode.

The above-described effect of reducing a ripple caused by an oblique symmetrical mode in the piezoelectric resonator 1 will be described with respect to the following examples.

A piezoelectric member 2 formed of lead titanate and having an approximate size of 2.5×0.4×0.3 mm was prepared as a laminated piezoelectric resonator 1. In this piezoelectric resonator 1, the opposed area of the excitation electrodes 3, 4 and 5 in the vibrating section D was about 0.4×0.6, the size of the lead-out electrodes 3a, 4a and 5a along the longitudinal direction of the piezoelectric member 2 was about 1.55 mm, and electrodes having a size of about 0.4×0.5 mm were formed as dummy electrodes 3a, 4b and 5b.

Figure 4:
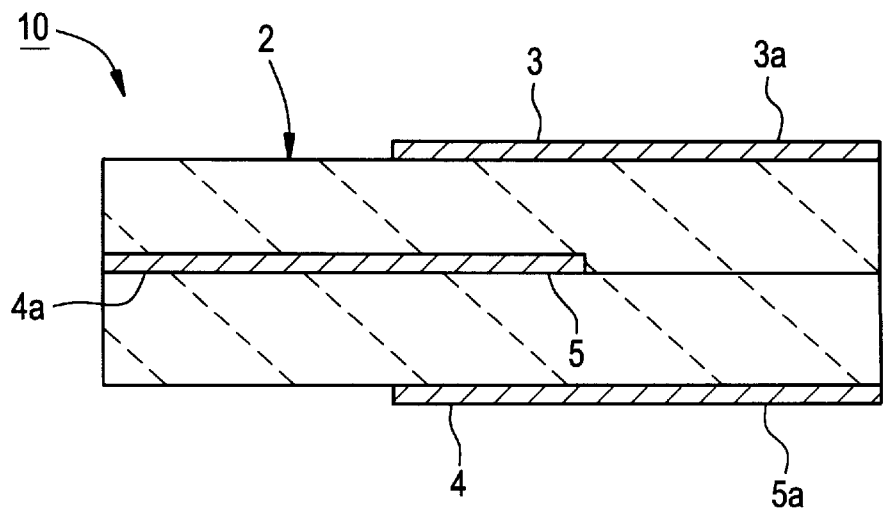
FIG. 4 is a schematic cross-sectional view of a laminated piezoelectric resonator adapted to vibrate in a thickness extensional vibration mode having no dummy electrodes, prepared for comparison to preferred embodiments of the present invention.

For comparison, a laminated piezoelectric resonator 10 adapted to vibrate in a thickness extensional vibration mode, such as shown in a schematic cross-sectional view of FIG. 4, was prepared by being formed in the same manner as the piezoelectric resonator 1 of the above-described preferred embodiment except that the above-described dummy electrodes 3b, 4b, and 5b were not included therein.

Figure 5:
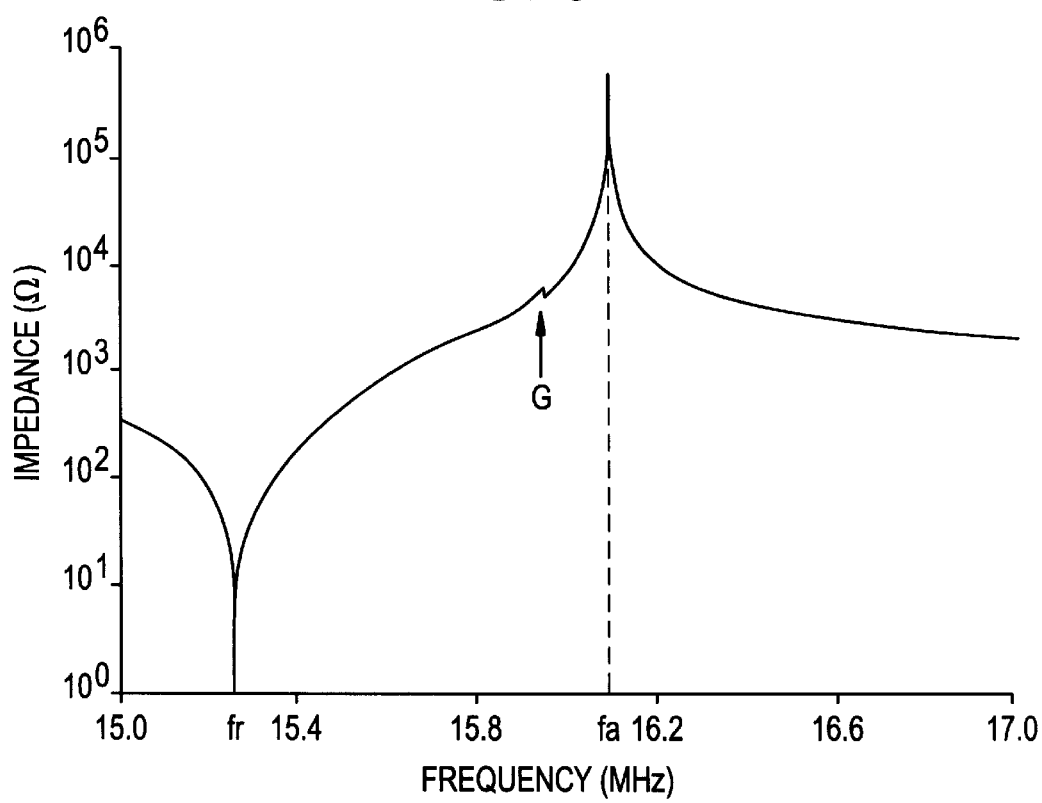
FIG. 5 is a graph showing an impedance-frequency characteristic of the piezoelectric resonator of the first preferred embodiment.
Figure 6:
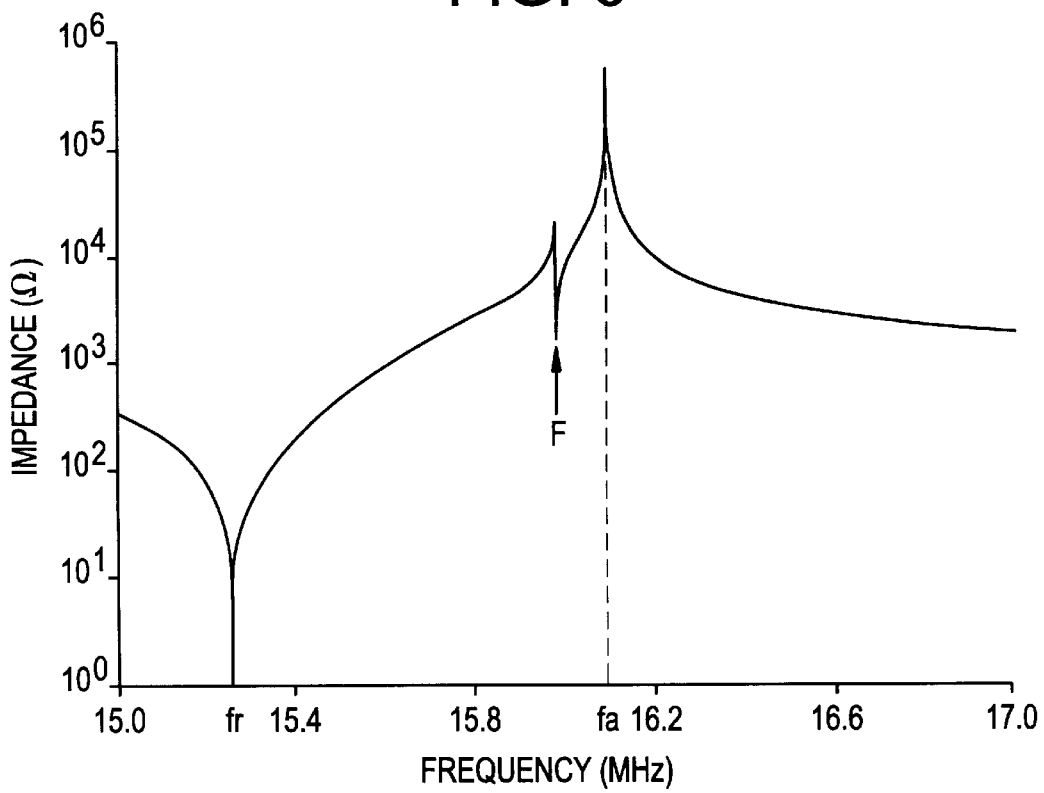
FIG. 6 is a graph showing an impedance-frequency characteristic of a laminated piezoelectric resonator adapted to vibrate in a thickness extensional vibration mode prepared for comparison to the first preferred embodiment.

FIGS. 5 and 6 respectively show impedance-frequency characteristics of the laminated piezoelectric resonators 1 and 10.

In the piezoelectric resonator 10 prepared for comparison, as can be clearly seen in FIG. 6, a large ripple, indicated by arrow F, is generated between a resonant frequency fr and an antiresonant frequency fa. This ripple resulted from an oblique symmetrical mode as described above.

In contrast, in the piezoelectric resonator 1 of this preferred embodiment, as can be clearly seen in FIG. 5, a ripple caused by an oblique symmetrical mode was very small, as indicated by arrow G, so as to be negligible or insignificant.

In the piezoelectric resonator 1 of this preferred embodiment, dummy electrodes 3b, 4b and 5b are disposed so as to have respective symmetrical relationships with the lead-out electrodes 3a, 4a and 5a relative to all of the excitation electrodes 3, 4 and 5. However, if a dummy electrode is disposed at least one of the vertical positions at which the excitation electrode 3, 4 or 5 is disposed and at such a position so as to have a symmetrical relationship with the lead-out electrode, the degree of symmetry of the electrode structure is greatly improved in comparison with that of the piezoelectric resonator 10 having no dummy electrode. In such a case, therefore, a ripple caused by an oblique symmetrical mode can also be reduced as in the above-described preferred embodiment.

In fact, the degree of symmetry of the electrode structure can be further improved if dummy electrodes 3b, 4b and 5b are respectively formed at all of the vertical positions at which the excitation electrodes 3, 4 and 5 are disposed, as in the case of the abovedescribed preferred embodiment. A ripple caused by an oblique symmetrical mode can be effectively reduced thereby, as shown in FIG. 5. Therefore, disposing the electrodes in the manner described with respect to the preferred embodiment is preferred.

A method of manufacturing the piezoelectric resonator 1 will be described hereinafter.

Figure 7:
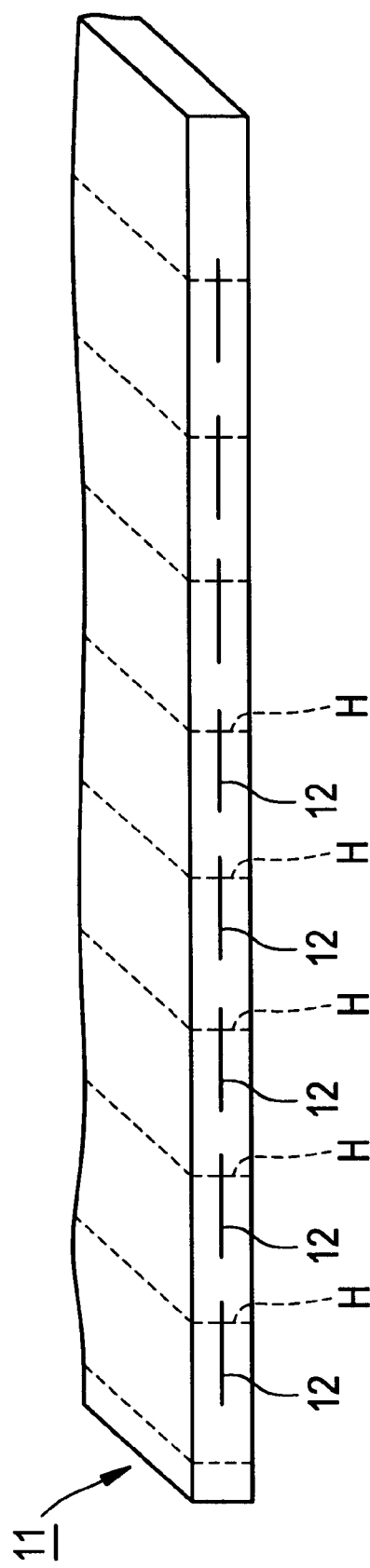
FIG. 7 is a schematic perspective view of a mother piezoelectric body prepared when the laminated piezoelectric resonator of the first preferred embodiment is manufactured.

Ordinarily, the piezoelectric resonator 1 is obtained by preparing a mother piezoelectric body for improving the mass-producibility and by cutting the mother piezoelectric body along the thickness direction. That is, a mother piezoelectric body corresponding to a planar matrix array of a plurality of units formed of the above-described excitation electrodes 3, 4 and 5, lead-out electrodes 3a, 4a and 5a and dummy electrodes 3b, 4b and 5b is provided. FIG. 7 is a schematic perspective view of this mother piezoelectric body. In FIG. 7, electrodes disposed on first and second major surfaces of the mother piezoelectric body 11 are not shown. That is, excitation electrodes 3 and 4, lead-out electrodes 3a and 4a and dummy electrodes 3a and 4b are not shown in FIG. 7.

In the mother piezoelectric body 11, electrodes 12 are preferably formed at a substantially central vertical position. The mother piezoelectric body 11 is cut along broken lines H in FIG. 7 in a direction that is substantially parallel to the thickness direction to form the excitation electrode 5 and the lead-out electrode 5a in each piezoelectric resonator 1 and the dummy electrode 5b of the adjacent piezoelectric resonator 1. That is, when the mother piezoelectric body 11 is prepared, the electrode film 12 is formed in which the excitation electrode 5 and the lead-out electrode 5a of each thickness extensional vibration piezoelectric resonator and the dummy electrode 6b of the adjacent piezoelectric resonator at the outer end of the lead-out electrode 5a are formed integrally with each other. The mother piezoelectric body 11 is cut along broken lines H parallel to the thickness direction, that is, electrode film 12 is divided to form the excitation electrode 5 and the lead-out electrode 5a of the piezoelectric resonator on one side and the dummy electrode 5b of the piezoelectric resonator on the other side.

Similarly, electrode films for forming excitation electrodes 3 and 4, the lead-out electrodes 3a and 4a, and dummy electrodes 3b and 4b disposed on the first and second major surfaces of the thickness extensional vibration piezoelectric resonators 1 are formed and cut along the above-mentioned broken lines H to form the excitation electrodes 3 and 4 and the lead-out electrodes 3a and 4a of the piezoelectric resonator on one side and the dummy electrodes 3b and 4b of the adjacent piezoelectric resonator.

Figure 12:
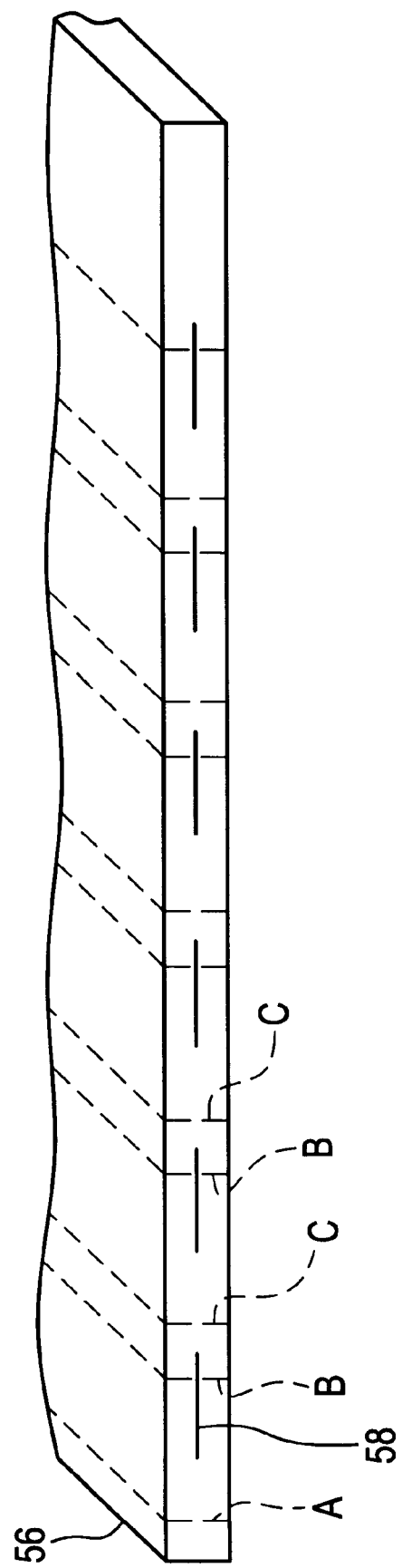
FIG. 12 is a perspective view of a mother piezoelectric body used for mass-production of the conventional laminated piezoelectric resonator adapted to vibrate in a thickness extensional vibration mode.

While, as shown in FIG. 12, the piezoelectric portion of the conventional piezoelectric resonator adapted to vibrate in a thickness extensional vibration mode defined between broken lines B and C and the electrode material in the piezoelectric portion are unnecessarily consumed in order to expose a lead-out electrode end surface at an end surface of each piezoelectric member when the piezoelectric resonator is manufactured, such unnecessary amounts of the piezoelectric material and the electrode material are not used when the piezoelectric resonator 1 of the above-described preferred embodiment is mass-produced. Therefore, the necessary amounts of the piezoelectric material and the electrode material can be reduced, thus achieving a reduction in the manufacturing cost of the piezoelectric resonator 1.

In the process of obtaining a mother piezoelectric body 11, a well-known laminated ceramic structure can be used. That is, electrodes corresponding to the electrode film 12 are printed by screen printing on piezoelectric ceramic green sheets, the ceramic green sheets on which the electrodes are printed are superposed so that excitation electrodes 3, 4 and 5, lead-out electrodes 3a, 4a and 5a and dummy electrodes 3a, 4a and 5b are in the positional relationship shown in FIG. 1, thereby obtaining a mother piezoelectric body. This mother piezoelectric body is pressed in the thickness direction and is thereafter cut along broken lines H to obtain laminate chips corresponding to thickness extensional vibration piezoelectric resonator 1 units. The laminate chips obtained in the above-described manner are fired and external electrodes 6 are formed by a suitable method such as deposition, plating or sputtering, thus obtaining thickness extensional vibration piezoelectric resonators 1.

The method of manufacturing the piezoelectric resonator 1 is not limited to that described above. Piezoelectric member 2 may be obtained by bringing previously fired piezoelectric plates into contact with each other.

In the piezoelectric resonator 1 of the above-described preferred embodiment, the excitation electrode 3, the lead-out electrode 3a and the dummy electrode 3b are disposed on the first major surface of piezoelectric member 2 while the excitation electrode 4, the lead-out electrode 4a and the dummy electrode 4b are disposed on the second major surface 2b. However, each of the excitation electrodes, the lead-out electrodes and the dummy electrodes may be embedded in the piezoelectric member.

Figure 8:
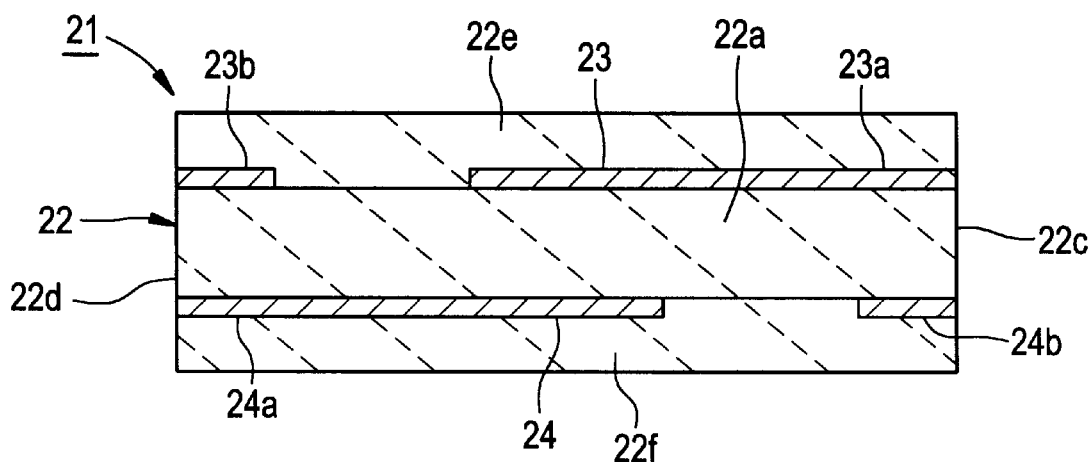
FIG. 8 is a schematic cross-sectional view of an example of a modification of the piezoelectric resonator of preferred embodiments of the present invention.
Figure 9:
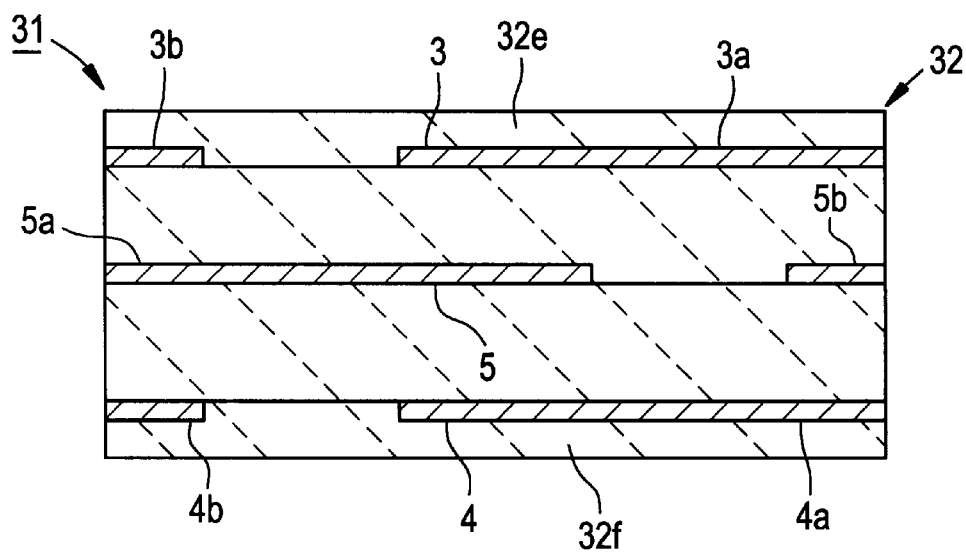
FIG. 9 is a schematic cross-sectional view of another example of a modification of the piezoelectric resonator of preferred embodiments of the present invention.

FIGS. 8 and 9 are schematic cross-sectional views of examples of modifications in which excitation electrodes, lead-out electrodes and dummy electrodes are formed in a piezoelectric member.

In a laminated piezoelectric resonator 21 adapted to generate a harmonic wave in a thickness extensional vibration mode shown in FIG. 8, excitation electrodes 23 and 24 are disposed in a piezoelectric member 22 by being superposed on each other in the thickness direction with a piezoelectric material layer 22a interposed therebetween. Outside the vibrating section in which the excitation electrodes 23 and 24 are superposed on each other, a lead-out electrode 23a is arranged to be connected to the excitation electrode 23, and a lead-out electrode 24a is arranged to be connected to the excitation electrode 24. The lead-out electrodes 23a and 24a are exposed at end surfaces of the piezoelectric member 22.

At the vertical positions at which the excitation electrodes 23 and 24 are disposed, dummy electrodes 23b and 24b are disposed so as to have symmetrical relationships with the lead-out electrodes 23a and 24a relative to the excitation electrodes 23 and 24.

Also in the piezoelectric resonator 21 adapted to generate a harmonic wave in a thickness extensional vibration mode, the degree of symmetry of the electrode structure is greatly improved since dummy electrodes 23b and 24b are provided and arranged as described above. As a result of this novel structure and arrangement, it is possible to reduce a ripple caused by an oblique symmetrical mode and to improve a resonance characteristic.

FIG. 9 is a schematic cross-sectional view of a laminated piezoelectric resonator adapted to generate a harmonic wave in a thickness extensional vibration mode representing another example of a modification in which excitation electrodes are provided in a piezoelectric member. A piezoelectric resonator 31 shown in FIG. 9 preferably has substantially the same construction as the piezoelectric resonator 1 of the first preferred embodiment except that piezoelectric layers 32e and 32f are provided outside of the excitation electrodes 3 and 4 in the thickness direction in a piezoelectric member 32. Also in the piezoelectric resonator 31, the degree of symmetry of the electrode structure is improved by forming and arranging dummy electrodes 3b, 4b and 5b as shown in FIG. 9. With this novel structure and arrangement, it is possible to greatly reduce a ripple caused by an oblique symmetrical mode and to achieve excellent resonance characteristics as in the case of the piezoelectric resonator of the first preferred embodiment.

While each of the excitation electrodes 3, 4 and 5, 23, and 24 is disposed in the above-described piezoelectric resonators 1, 21, and 31 so as to extend through the entire width of the elongated strip-like piezoelectric member 2, the shape of the excitation electrodes in the piezoelectric resonator of preferred embodiments of the present invention is not limited to the illustrated example.

Figure 10:
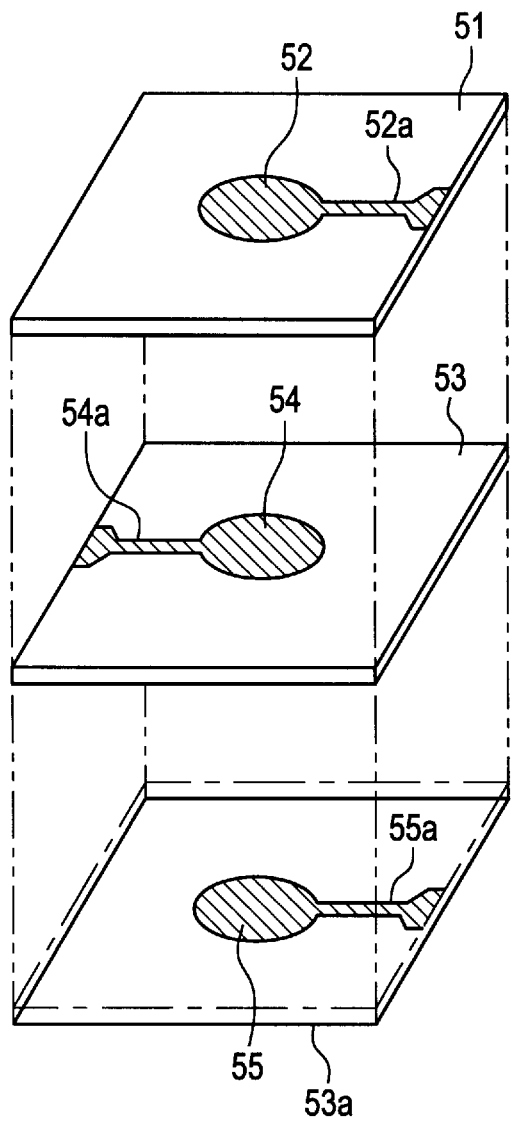
FIG. 10 is an exploded perspective view of a conventional piezoelectric resonator adapted to vibrate in a thickness extensional vibration mode.
Figure 11:
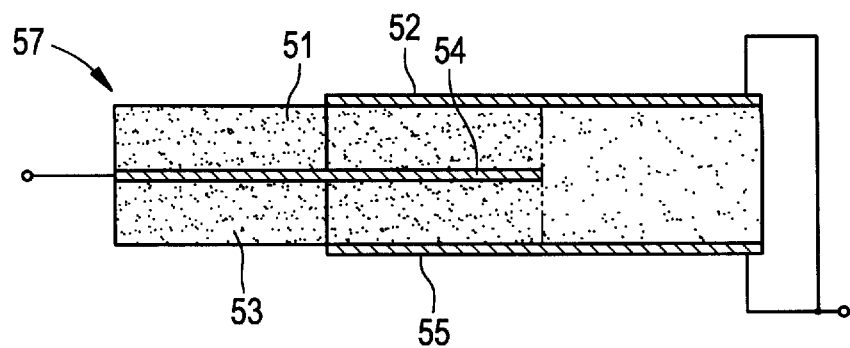
FIG. 11 is an exploded perspective view of a conventional laminated piezoelectric resonator adapted to vibrate in a thickness extensional vibration mode.

For example, excitation electrodes having a generally circular shape or any other geometrical shape may be disposed so as to occupy only partial areas at an approximate center of a piezoelectric member, as are those in the conventional longitudinal-vibration piezoelectric resonator shown in FIG. 10.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:
  a piezoelectric member including piezoelectric layers;
  a plurality of excitation electrodes disposed at respective vertical positions on or within said piezoelectric member and superposed on one another in a thickness direction of said piezoelectric member with said piezoelectric layers of said piezoelectric member interposed therebetween;
  lead-out electrodes respectively connected to said excitation electrodes and extending to side surfaces of the piezoelectric member at the same vertical positions as the excitation electrodes; and
  at least one dummy electrode disposed at least one of the vertical positions at which said excitation electrodes are disposed and arranged to have a symmetrical relationship with the lead-out electrode connected to the excitation electrode relative to the corresponding excitation electrode wherein said plurality of excitation electrodes are disposed within said piezoelectric member, a piezoelectric layer existing outside in the thickness direction of an outermost excitation electrode of said plurality of excitation electrodes.

2. The piezoelectric resonator according to claim 1, wherein said piezoelectric member is an elongated strip-like piezoelectric member including a longer side and a shorter side and a substantially planar shape.

3. A piezoelectric resonator, comprising:
  a piezoelectric member including piezoelectric layers;
  a plurality of excitation electrodes disposed at different vertical positions on or within said piezoelectric member and superposed on one another in a thickness direction of said piezoelectric member with said piezoelectric layers of said piezoelectric member interposed therebetween;
  lead-out electrodes respectively connected to said excitation electrodes and extending to side surfaces of the piezoelectric member at the same vertical positions as the excitation electrodes; and
  at least one dummy electrode disposed at at least one of the different vertical positions at which said excitation electrodes are disposed and arranged to extend from the first longitudinal end toward a center of the piezoelectric member and spaced from one of the plurality of excitation electrodes which is disposed at said at least one of the different vertical positions at which said at least one dummy electrode is disposed, the at least one dummy electrode being arranged to have a symmetrical relationship with the lead-out electrode connected to the excitation electrode relative to the corresponding excitation electrode, said at least one dummy electrode extending to an edge of the piezoelectric member.

4. The piezoelectric resonator according to claim 1, wherein said piezoelectric member includes a first major surface and a second major surface, and
  said plurality of excitation electrodes include first and second excitation electrodes disposed on said first and second major surfaces of said piezoelectric member, respectively and an internal excitation electrode disposed within said piezoelectric member.

5. The piezoelectric resonator according to claim 4, wherein said piezoelectric member is an elongated strip-like piezoelectric member including a longer side and a shorter side and a substantially planar shape.

6. The piezoelectric resonator according to claim 3, wherein said piezoelectric member is an elongated strip-like piezoelectric member including a longer side and a shorter side and a substantially planar shape.

7. The piezoelectric resonator according to claim 4, wherein said lead-out electrodes connected to said first and second excitation electrodes extend to a side surface of the piezoelectric member and have the same width as a width of the first and second excitation electrodes.

8. The piezoelectric resonator according to claim 7, wherein said piezoelectric member has a substantially elongated rectangular shape including a longer side and a shorter side;
  the lead-out electrodes connected to said first and second excitation electrodes extend to a side surface of the piezoelectric member at an end in a longitudinal direction of the piezoelectric member; and
  said first and second excitation electrodes are disposed so as to extend to both ends of the piezoelectric member in a width direction of the piezoelectric member.

9. The piezoelectric resonator according to claim 3, wherein the resonator is adapted to generate a harmonic wave in a thickness extensional vibration mode.

10. The piezoelectric resonator according to claim 3, said piezoelectric member includes a substantially rectangular plate.

11. The piezoelectric resonator according to claim 3, further comprising a plurality of dummy electrodes disposed at the vertical positions at which said excitation electrodes are disposed and arranged to have a symmetrical relationship with respective ones of the lead-out electrodes connected to respective ones of the excitation electrodes relative to the corresponding excitation electrode.

12. The piezoelectric resonator according to claim 3, further comprising a plurality of dummy electrodes disposed at each of the vertical positions at which said excitation electrodes are disposed and arranged to have a symmetrical relationship with respective ones of each of the lead-out electrodes connected to respective ones of each of the excitation electrodes relative to the corresponding excitation electrode.

13. The piezoelectric resonator according to claim 11, wherein at least two of the dummy electrodes are disposed at common longitudinal positions at a first end of the piezoelectric member and are disposed at different vertical positions on or within said piezoelectric member.

14. The piezoelectric resonator according to claim 12, wherein at least two of the dummy electrodes are disposed at common positions at a first end of the piezoelectric member.

15. The piezoelectric resonator according to claim 3, wherein each of the lead-out electrodes are disposed within the piezoelectric member.

16. The piezoelectric resonator according to claim 3, wherein the at least one dummy electrode is disposed on an external surface of the piezoelectric member.

17. A piezoelectric resonator, comprising:
a piezoelectric member including piezoelectric layers;
a plurality of excitation electrodes disposed at respective vertical positions on or within said piezoelectric member and superposed on one another in a thickness direction of said piezoelectric member with said piezoelectric layers of said piezoelectric member interposed therebetween;
lead-out electrodes respectively connected to said excitation electrodes and extending to side surfaces of the piezoelectric member at the same vertical positions as the excitation electrodes; and
at least one dummy electrode disposed at at least one of the vertical positions at which said excitation electrodes are disposed and arranged to have a symmetrical relationship with the lead-out electrode connected to the excitation electrode relative to the corresponding excitation electrode, wherein at least one of the lead-out electrodes is disposed within the piezoelectric member and at least one of the lead-out electrodes is disposed on an external surface of the piezoelectric member.

18. A piezoelectric resonator, comprising:
a piezoelectric member including piezoelectric layers;
a plurality of excitation electrodes disposed at respective vertical positions on or within said piezoelectric member and superposed on one another in a thickness direction of said piezoelectric member with said piezoelectric layers of said piezoelectric member interposed therebetween;
lead-out electrodes respectively connected to said excitation electrodes and extending to side surfaces of the piezoelectric member at the same vertical positions as the excitation electrodes; and
a plurality of dummy electrodes disposed at each of the vertical positions at which said excitation electrodes are disposed and arranged to have a symmetrical relationship with respective ones of each of the lead-out electrodes connected to respective ones of each of the excitation electrodes relative to the corresponding excitation electrode, wherein at least one of the dummy electrodes is disposed within the piezoelectric member and at least one of the dummy electrodes is disposed on an external surface of the piezoelectric member.

19. A piezoelectric resonator, comprising:
a piezoelectric member including piezoelectric layers and first and second longitudinal ends disposed opposite from each other along a length of the piezoelectric member;
a plurality of excitation electrodes disposed at different vertical positions on or within said piezoelectric member and superposed on one another in a thickness direction of said piezoelectric member with said piezoelectric layers of said piezoelectric member interposed therebetween;
lead-out electrodes respectively connected to said excitation electrodes and located at the same vertical positions as the excitation electrodes; and
at least one dummy electrode disposed at at least one of the different vertical positions at which said excitation electrodes are disposed and arranged to extend from the first longitudinal end toward the second longitudinal end of the piezoelectric member and spaced from one of the plurality of excitation electrodes which is disposed at said at least one of the different vertical positions at which said at least one dummy electrode is disposed, and one of the plurality of lead out electrodes which is connected to said one of the plurality of excitation electrodes is arranged to extend from the second longitudinal end toward the first longitudinal end of the piezoelectric member.

* * * * *